United States Patent
Lin et al.

(10) Patent No.: US 10,700,049 B2
(45) Date of Patent: Jun. 30, 2020

(54) LIGHT-EMITTING DIODE PACKAGE STRUCTURE AND MANUFACTURING METHOD THEREOF

(71) Applicant: Unimicron Technology Corp., Taoyuan (TW)

(72) Inventors: Wei-Ti Lin, Hsinchu County (TW); Chun-Hsien Chien, Hsinchu (TW); Fu-Yang Chen, Hsinchu County (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/161,080

(22) Filed: Oct. 16, 2018

(65) Prior Publication Data

US 2020/0075564 A1 Mar. 5, 2020

(30) Foreign Application Priority Data

Sep. 3, 2018 (TW) .............................. 107130865 A

(51) Int. Cl.
*H01L 25/16* (2006.01)
*H01L 23/00* (2006.01)
(Continued)

(52) U.S. Cl.
CPC ............ *H01L 25/167* (2013.01); *H01L 24/16* (2013.01); *H01L 24/24* (2013.01); *H01L 24/81* (2013.01); *H01L 25/0753* (2013.01); *H01L 33/62* (2013.01); *H01L 2224/16141* (2013.01); *H01L 2224/16227* (2013.01); *H01L 2224/2402* (2013.01); *H01L 2224/245* (2013.01); *H01L 2224/24011* (2013.01);
(Continued)

(58) Field of Classification Search
CPC ................................ H01L 2224/75733–75735
See application file for complete search history.

(56) References Cited

U.S. PATENT DOCUMENTS 9,685,421 B2 6/2017 Aleksov et al.
2017/0141021 A1* 5/2017 Agrawal ........... H01L 23/49822
(Continued)

FOREIGN PATENT DOCUMENTS

WO 2005122706 12/2005

OTHER PUBLICATIONS

"Office Action of Taiwan Counterpart Application," dated Mar. 13, 2019, p. 1-p. 3.

*Primary Examiner* — Amar Movva
(74) *Attorney, Agent, or Firm* — JCIPRNET

(57) ABSTRACT

A light-emitting diode package structure includes a carrier, at least one self-assembled material layer, a first solder mask layer, and at least one light-emitting diode. The carrier includes a first build-up circuit. The self-assembled material layer is disposed on the first build-up circuit. The first solder mask layer is disposed on the first build-up circuit. The first solder mask layer has at least one opening to expose a portion of the self-assembled material layer. The light-emitting diode is disposed on the first build-up circuit. The light-emitting diode has a self-assembled pattern. The light-emitting diode is self-assembled into the opening of the first solder mask layer through a force between the self-assembled pattern and the self-assembled material layer. A manufacturing method of the light-emitting diode package structure is also provided.

9 Claims, 13 Drawing Sheets

(51) Int. Cl.
*H01L 25/075* (2006.01)
*H01L 33/62* (2010.01)
(52) U.S. Cl.
CPC ............... *H01L 2224/24146* (2013.01); *H01L 2224/24147* (2013.01); *H01L 2224/24227* (2013.01); *H01L 2224/81143* (2013.01); *H01L 2924/01026* (2013.01); *H01L 2924/01027* (2013.01); *H01L 2924/01028* (2013.01); *H01L 2933/0033* (2013.01); *H01L 2933/0066* (2013.01)

(56) References Cited

U.S. PATENT DOCUMENTS

2017/0194302 A1\* 7/2017 Disney .................... H01L 33/62
2017/0278783 A1 9/2017 Agrawal et al.

\* cited by examiner

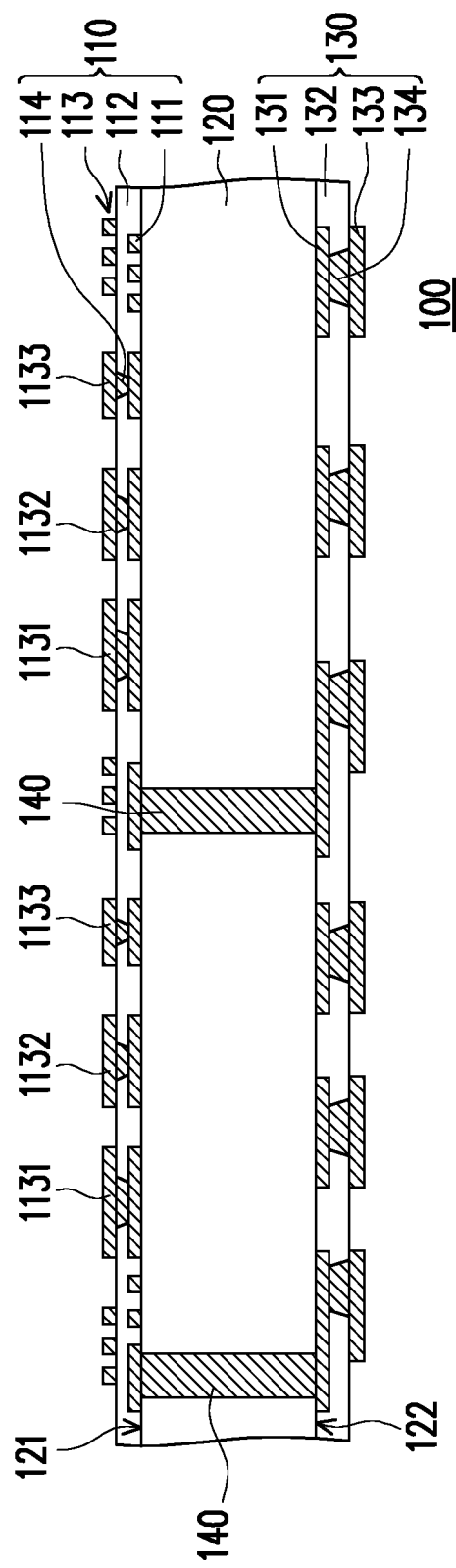
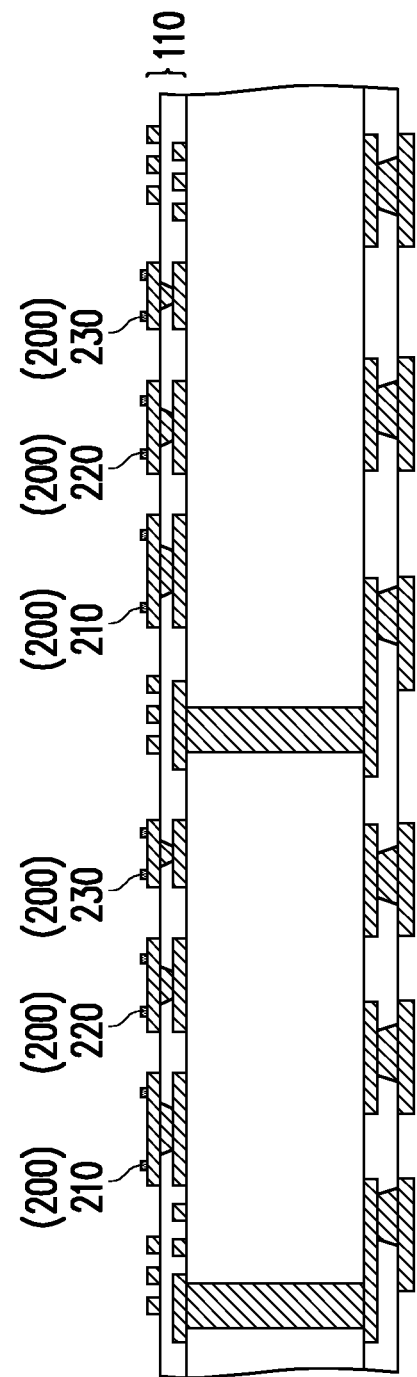

LIGHT-EMITTING DIODE PACKAGE STRUCTURE AND MANUFACTURING METHOD THEREOF

CROSS REFERENCE TO RELATED APPLICATION

This application claims the priority benefit of Taiwan application serial no. 107130865, filed on Sep. 3, 2018. The entirety of the above-mentioned patent application is hereby incorporated by reference herein and made a part of specification.

BACKGROUND

Technical Field

The invention relates to a light-emitting diode package structure and a manufacturing method thereof. More particularly, the invention relates to a light-emitting diode package structure featuring self-assembling and a manufacturing method thereof.

Description of Related Art

Currently, the non-solder mask define (NSMD) structure is used in the back plate structure of the mini light-emitting diodes (mini LEDs) or the micro light-emitting diodes (µLEDs) most of the time. In order to enhance fineness and resolution of screens, matrixes of high-density are required to be arranged for assembling, and a massive amount of transferring operation is also required. In the assembling process, the alignment system of machines may be used to perform processes such as the alignment process, the pickup and mounting process, and the thermocompression bonding process to bond a LED die and a back plate. Nevertheless, the size of the die is extremely small, and a large amount of transferring is required, and thus, if the bonding process relies only on the precision of the alignment system of the machines, unfavorable alignment may be generated, so that the yield may further be affected.

SUMMARY

The invention provides a light-emitting diode package structure capable of improving a poor alignment problem during transferring of light-emitting diodes and increasing yield of transferring.

The invention further provides a manufacturing method of a light-emitting diode package structure capable of manufacturing the light-emitting diode package structure.

A light-emitting diode package structure provided by an embodiment of the invention includes a carrier, at least one self-assembled material layer, a first solder mask layer, and at least one light-emitting diode. The carrier includes a first build-up circuit. The at least one self-assembled material layer is disposed on the first build-up circuit. The first solder mask layer is disposed on the first build-up circuit. The first solder mask layer has at least one opening to expose a portion of the at least one self-assembled material layer. The at least one light-emitting diode is disposed on the first build-up circuit. The at least one light-emitting diode has a self-assembled pattern. The at least one light-emitting diode is self-assembled into the at least one opening of the first solder mask layer through a force between the self-assembled pattern and the at least one self-assembled material layer.

In an embodiment of the invention, the at least one opening includes at least one first opening, at least one second opening, and at least one third opening. A size of the at least one first opening is greater than a size of the at least one second opening, and the size of the at least one second opening is greater than a size of the at least one third opening.

In an embodiment of the invention, the at least one light-emitting diode includes at least one first light-emitting diode, at least one second light-emitting diode, and at least one third light-emitting diode. The first light-emitting diode has a first self-assembled pattern, the second light-emitting diode has a second self-assembled pattern, and a third light-emitting diode has a third self-assembled pattern. The size of the at least one first opening, the size of the at least one second opening, and the size of the at least one third opening respectively correspond to a size of the first self-assembled pattern, a size of the second self-assembled pattern, and a size of the third self-assembled pattern.

In an embodiment of the invention, a shape of the at least one first opening, a shape of the at least one second opening, and a shape of the at least one third opening respectively correspond to a shape of the first self-assembled pattern, a shape of the second self-assembled pattern, and a shape of the third self-assembled pattern.

In an embodiment of the invention, the self-assembled pattern includes a magnetic material, and the at least one self-assembled material layer includes a magnetic material.

In an embodiment of the invention, the light-emitting diode package structure further includes at least one first surface treatment layer, an adhesive layer, and a light transmissive layer. The at least one first surface treatment layer is disposed in the at least one opening of the first solder mask layer. The adhesive layer is disposed on the first solder mask layer and encapsulates the at least one light-emitting diode. The light transmissive layer is disposed on the adhesive layer. The light transmissive layer and the first solder mask layer are respectively located at two opposite sides of the adhesive layer. The carrier further includes at least one chip and an encapsulant. The at least one chip has an active surface. The encapsulant encapsulates the at least one chip. The at least one light-emitting diode and the at least one chip are separately located at two opposite sides of the first build-up circuit.

In an embodiment of the invention, the carrier further includes a second build-up circuit, at least one second surface treatment layer, and at least one conductive through hole. The second build-up circuit is disposed on the at least one chip. The at least one second surface treatment layer is disposed between the second build-up circuit and the active surface of the at least one chip. The at least one conductive through hole is electrically connected to the first build-up circuit and the second build-up circuit.

In an embodiment of the invention, the carrier further includes a substrate, a plurality of bumps, and a second solder mask layer. The substrate is disposed between the first build-up circuit and the second build-up circuit. The bumps are disposed on the active surface of the at least one chip to be electrically connected to the second build-up circuit and the at least one chip. The second solder mask layer is disposed between the second build-up circuit and the encapsulant and exposes a portion of the second build-up circuit. The at least one second surface treatment layer is disposed between the portion of the second build-up circuit exposed by the second solder mask layer and the bumps. The at least one conductive through hole penetrates the substrate. The active surface faces the at least one light-emitting diode.

In an embodiment of the invention, the at least one conductive through hole penetrates the encapsulant, and the active surface backs onto the at least one light-emitting diode. The carrier further includes a substrate. The substrate is disposed on the second build-up circuit. The at least one light-emitting diode and the substrate are separately located at two opposite sides of the at least one chip.

In an embodiment of the invention, the carrier further includes at least one second surface treatment layer. The at least one second surface treatment layer is disposed between the first build-up circuit and the active surface of the at least one chip. The active surface faces the at least one light-emitting diode.

The manufacturing method of the light-emitting diode package structure provided by an embodiment of the invention includes the following steps. A carrier is formed, and the carrier includes a first build-up circuit. At least one self-assembled material layer is formed on the first build-up circuit. A first solder mask layer is formed on the first build-up circuit. The first solder mask layer has at least one opening to expose a portion of the at least one self-assembled material layer. At least one light-emitting diode is disposed on the first build-up circuit. The at least one light-emitting diode has a self-assembled pattern. The at least one light-emitting diode is self-assembled into the at least one opening of the first solder mask layer through a force between the self-assembled pattern and the at least one self-assembled material layer.

In an embodiment of the invention, the manufacturing method of the light-emitting diode package structure further includes the following steps. At least one first surface treatment layer is formed in the at least one opening of the first solder mask layer after the first solder mask layer is formed on the first build-up circuit. An adhesive layer is formed on the first solder mask layer after the at least one the light-emitting diode is disposed on the first build-up circuit to encapsulate the at least one light-emitting diode. The light transmissive layer is disposed on the adhesive layer. The light transmissive layer and the first solder mask layer are respectively located at two opposite sides of the adhesive layer. The step of forming the carrier includes the following steps. A substrate is provided. A first build-up circuit is formed on the substrate.

In an embodiment of the invention, the step of forming the carrier further includes the following steps. A second build-up circuit is formed on the substrate. At least one conductive through hole is formed to be electrically connected to the first build-up circuit and the second build-up circuit. At least one second surface treatment layer is formed on the second build-up circuit. At least one chip is disposed on the second build-up circuit so that the at least one second surface treatment layer is located between the second build-up circuit and the at least one chip. An encapsulant is formed to encapsulate the at least one chip. The at least one light-emitting diode and the at least one chip are separately located at two opposite sides of the first build-up circuit.

In an embodiment of the invention, the at least one chip has a plurality of bumps, and the bumps are located on the active surface of the at least one chip to be electrically connected to the second build-up circuit and the at least one chip. The step of forming the carrier further includes the following. A second solder mask layer is formed between the second build-up circuit and the encapsulant to expose a portion of the second build-up circuit. The substrate is located between the first build-up circuit and the second build-up circuit. The at least one conductive through hole penetrates the substrate, and the active surface faces the at least one light-emitting diode.

In an embodiment of the invention, the at least one light-emitting diode and the substrate are separately located at two opposite sides of the at least one chip. The at least one conductive through hole penetrates the encapsulant. The active surface of the at least one chip backs onto the at least one light-emitting diode.

In an embodiment of the invention, after the first solder mask layer is formed on the first build-up circuit, the method further includes the following steps. The substrate is separated. At least one second surface treatment layer is formed on the first build-up circuit so that the at least one second surface treatment layer and the first surface treatment layer are separately located at two opposite sides of the first build-up circuit. At least one chip is disposed on the at least one second surface treatment layer. An encapsulant is formed to encapsulate the at least one chip. The at least one light-emitting diode and the at least one chip are separately located at two opposite sides of the first build-up circuit. The active surface of the at least one chip faces the at least one light-emitting diode.

To sum up, in the light-emitting diode package structure provided by the embodiments of the invention, the light-emitting diode package structure includes the carrier, the at least one self-assembled material layer, the first solder mask layer, and at least one the light-emitting diode having the self-assembled pattern. Herein, the at least one light-emitting diode is self-assembled into the at least one opening of the first solder mask layer through a force between the self-assembled pattern and the at least one self-assembled material layer, so that the at least one light-emitting diode is disposed on the carrier. Through such a design, in the light-emitting diode package structure of this invention, the problem of poor alignment during transferring of the at least one light-emitting diodes is improved, and the yield of transferring is also increased.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 1A to FIG. 1E are schematic cross-sectional views illustrating a manufacturing method of a light-emitting diode package structure according to an embodiment of the invention.

DESCRIPTION OF THE EMBODIMENTS

Figure 1C:
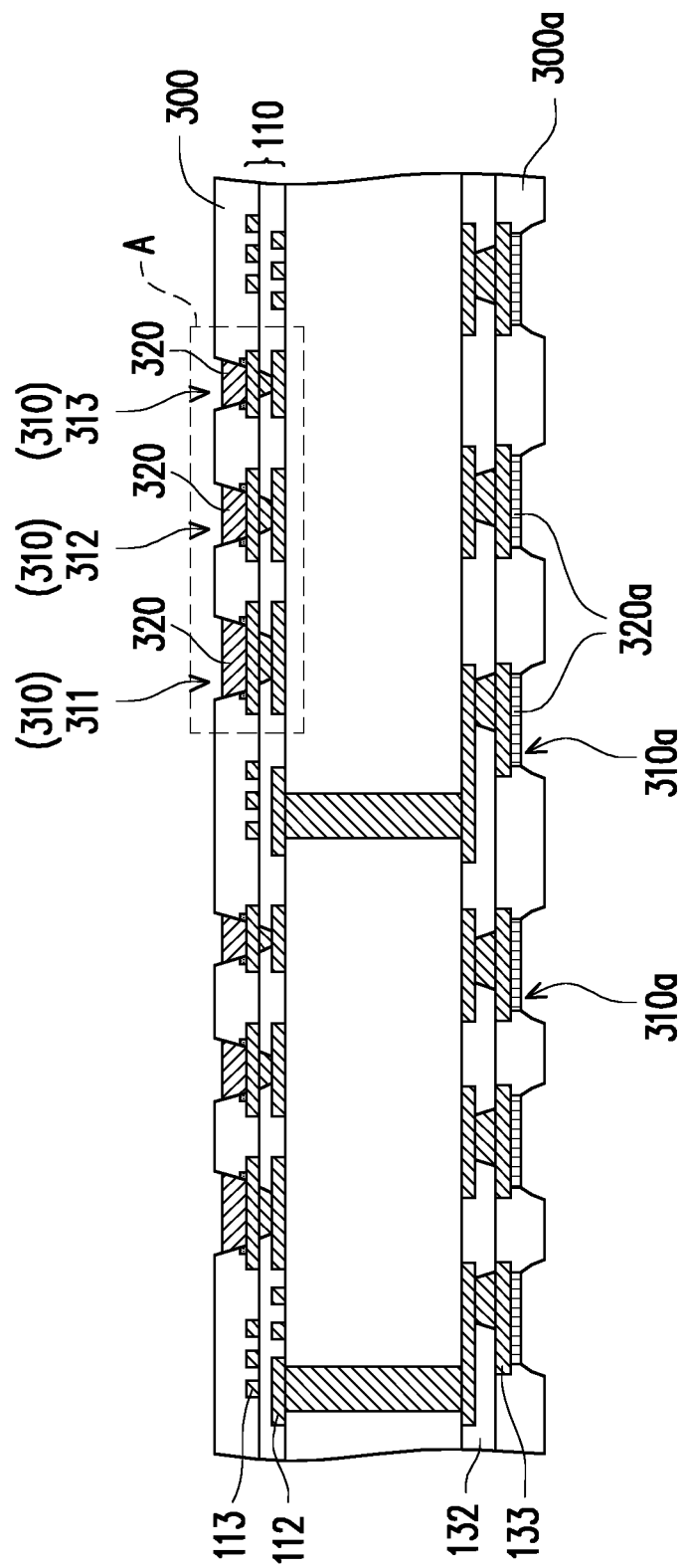

FIG. 1A to FIG. 1E are schematic cross-sectional views illustrating a manufacturing method of a light-emitting diode package structure according to an embodiment of the invention.

With reference to FIG. 1A, a carrier 100 is formed, and the carrier 100 at least includes a first build-up circuit 110. Specifically, in this embodiment, a substrate 120 is provided first, and the substrate 120 is drilled through a, for example, laser manner to form opening holes penetrating the substrate 120. Next, the opening holes are filled with a conductive material to form conductive through holes 140. The first build-up circuit 110 is formed on an upper surface 121 of the substrate 120, and a second build-up circuit 130 is formed on a lower surface 122 of the substrate 120. Herein, the first build-up circuit 110 includes a first conductive layer 111, a first dielectric layer 112, a second conductive layer 113, and a first conductive hole 114 penetrating the first dielectric layer 112. The second build-up circuit 130 includes a third conductive layer 131, a second dielectric layer 132, a fourth conductive layer 133, and a second conductive hole 134 penetrating the second dielectric layer 132. Herein, the first conductive hole 114 is electrically connected to the first conductive layer 111 and the second conductive layer 113, and the second conductive hole 134 is electrically connected to the third conductive layer 131 and the fourth conductive layer 133. It thus can be seen that the substrate 120 is located between the first build-up circuit 110 and the second build-up circuit 130. The conductive through holes 140 penetrate the substrate 120 and are electrically connected to the first build-up circuit 110 and the second build-up circuit 130. Here, the substrate 120 may be a glass substrate, a ceramics substrate, a Si substrate, or a polymer glass fiber composite substrate. A material of the first conductive layer 111, the second conductive layer 113, the first conductive hole 114, the third conductive layer 131, the fourth conductive layer 133, and the second conductive hole 134 may be copper, silver, gold, or other highly conductive materials. A material of the first dielectric layer 112 and the second dielectric layer 132 may be, for example, a photoimageable dielectric material, polyimide, an ajinomoto build-up film (ABF) or resin, or a polymer glass fiber composite material.

In addition, in some embodiments, the second conductive layer 113 of the first build-up circuit 110 further includes a first pad 1131, a second pad 1132, and a third pad 1133. Herein, a size of the first pad 1131 is greater than a size of the second pad 1132, and the size of the second pad 1132 is greater than a size of the third pad 1133.

Next, with reference to FIG. 1B, at least one self-assembled material layer 200 (6 self-assembled material layers 200 are schematically illustrated in FIG. 1B) is formed on the first build-up circuit 110. Specifically, in this embodiment, a first self-assembled material layer 210 corresponding to the size of the first pad 1131, a second self-assembled material layer 220 corresponding to the size of the second pad 1132, and a third self-assembled material layer 230 corresponding to the size of the third pad 1133 are formed through manners such as sputtering, plasma enhanced chemical vapor deposition (PECVD), or pressure laminating and the like together with a photolithography process, an etch process, etc. Hence, a size of the first self-assembled material layer 210 is greater than a size of the second self-assembled material layer 220, and the size of the second self-assembled material layer 220 is greater than a size of the third self-assembled material layer 230.

Figure 2B:
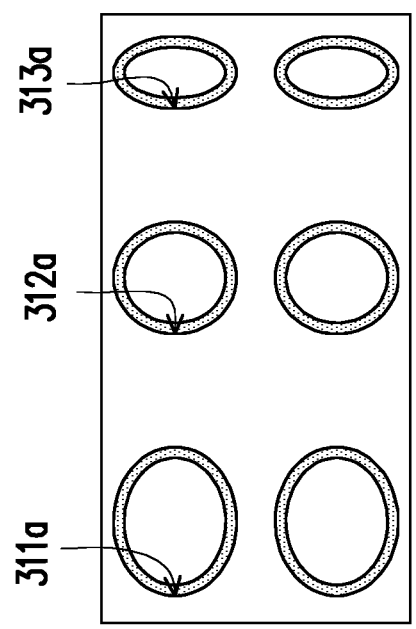
FIG. 2A and FIG. 2B are top views illustrating a region A in FIG. 1C.
Figure 2A:
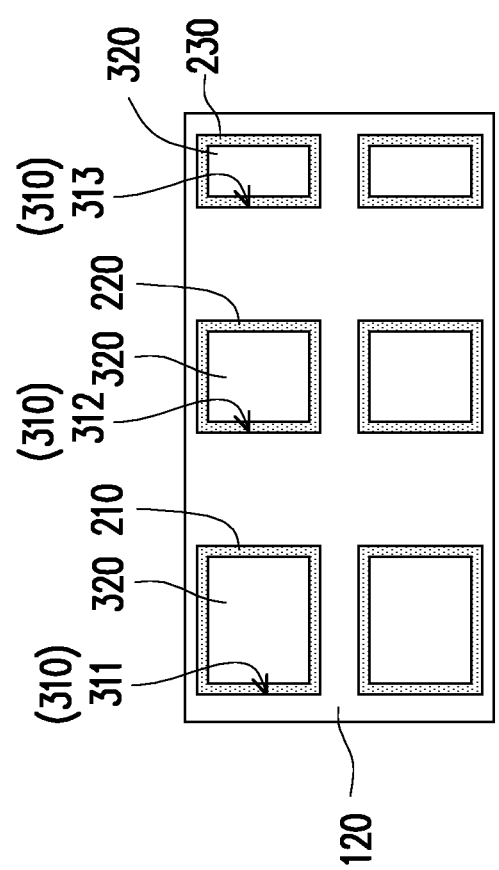

With reference to FIG. 1C and FIG. 2A, a first solder mask layer 300 is then formed on the first build-up circuit 110, and a second solder mask layer 300a on the second build-up circuit 130. Next, at least one first surface treatment layer 320 (6 first surface treatment layers are schematically illustrated in FIG. 1C) is formed in openings 310 of the first solder mask layer 300, and at least one second surface treatment layer 320a (6 second surface treatment layers are schematically illustrated in FIG. 1C) is formed in openings 310a of the second solder mask layer 300a. Herein, FIG. 2A and FIG. 2B are top views illustrating a region A in FIG. 1C, and the first solder mask layer 300 and the first build-up circuit 110 are omitted.

Specifically, in this embodiment, the first solder mask layer 300 is formed first to cover the first dielectric layer 112 and the second conductive layer 113 of the first build-up circuit 110, and the second solder mask layer 300a is formed to cover the second dielectric layer 132 and the fourth conductive layer 133 of the second build-up circuit 130. Herein, the first solder mask layer 300 has at least one of the openings 310 (6 openings are schematically illustrated in FIG. 1C) to expose a portion of the self-assembled material layer 220 and the second conductive layer 113. The second solder mask layer 300a has at least one of the openings 310a (6 openings are schematically illustrated in FIG. 1C) to expose a portion of the fourth conductive layer 133. Here, a material of the first solder mask layer 300 and the second solder mask layer 300a may be, for example, a photosensitive polymer material, but is not limited thereto.

Next, after the first solder mask layer 300 is formed on the first build-up circuit 110, the first surface treatment layers 320 are formed in the openings 310 of the first solder mask layer 300 to cover the second conductive layer 113 exposed by the first solder mask layer 300. After the second solder mask layer 300a is formed on the second build-up circuit 130, the second surface treatment layers 320a are formed in the openings 310a of the second solder mask layer 300a to cover the fourth conductive layer 133 exposed by the second solder mask layer 300a. Here, a material of the first surface treatment layers 320 and the second surface treatment layers 320a may be, for example, SAC, SnBe, SnSb, or other suitable alloy materials.

Note that, with reference to FIG. 1C and FIG. 2A together, in some embodiments, the openings 310 of the first solder mask layer 300 further include a first opening 311, a second opening 312, and a third opening 313. Herein, a size of the first opening 311 is greater than a size of the second opening 312, and the size of the second opening 312 is greater than a size of the third opening 313, which are not limited in this regard. That is, in other embodiments, the sizes of the first opening, the second opening, and the third opening may be identical. Therefore, in some embodiments. a process of the first solder mask layer 300 may be used to define the first opening 311, the second opening 312, and the third opening 313 of the same of different sizes.

In addition, in this embodiment, a shape of the first opening 311, a shape of the second opening 312, and a shape of the third opening 313 may be, for example, rectangles, but are not limited thereto. In other embodiments, a shape of the first opening 311a, a shape of the second opening 312a, and a shape of the third opening 313a may also be ovals (as shown in FIG. 2B) or other shapes suited for package connection. In addition, although the shape of the first opening 311, the shape of the second opening 312, and the shape of the third opening 313 are rectangles similar to one another in this embodiment, the shape of the first opening, the shape of the second opening, and the shape of the third opening may be different from one another (not shown) in other embodiments.

Figure 1D:
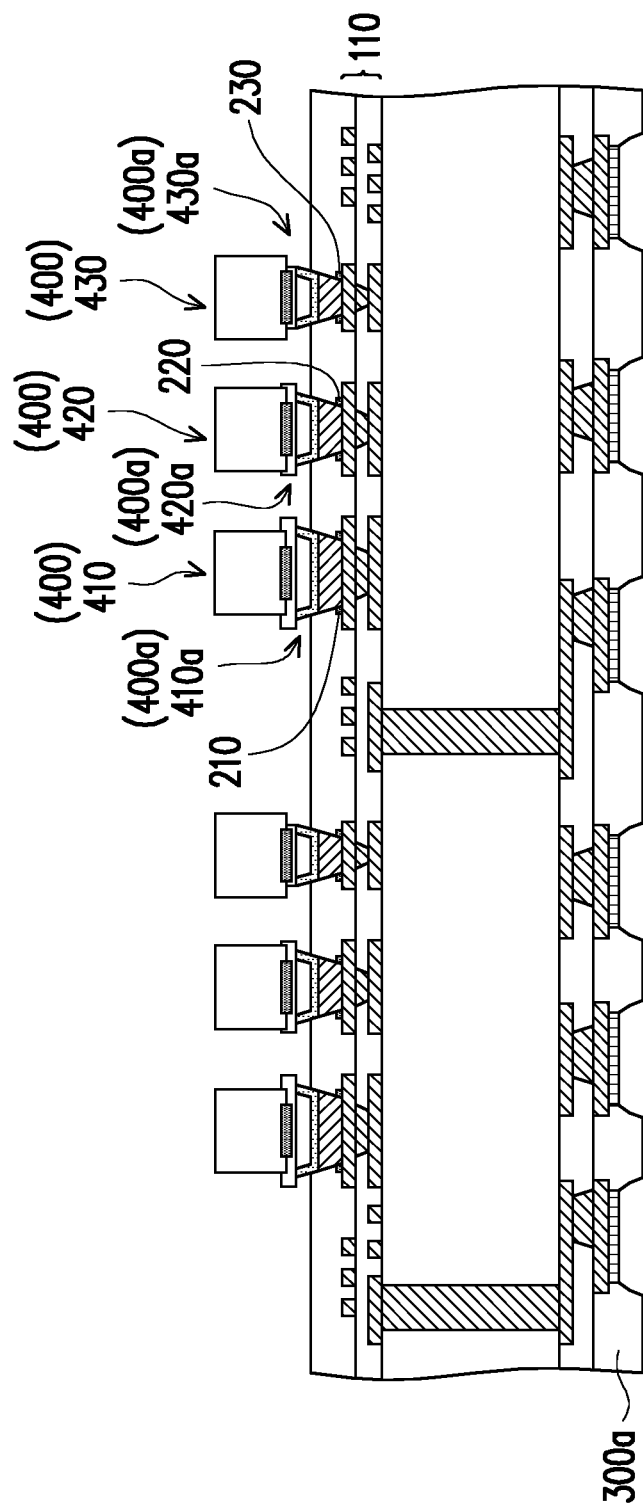

With reference to FIG. 1D, at least one light-emitting diode 400 (6 light-emitting diodes 400 are schematically illustrated in FIG. 1C) is then disposed on the first build-up circuit 110. Herein, the light-emitting diodes 400 have self-assembled patterns 400a. Specifically, in this embodiment, each of the light-emitting diodes 400 may be a mini light-emitting diode (mini LED) or a micro light-emitting diode (μLED). Herein, a size of the mini LED is greater than 125 μm, and a size of the μLED is less than 125 μm. In this embodiment, the light-emitting diodes 400 may include a first light-emitting diode 410, a second light-emitting diode 420, and a third light-emitting diode 430. Herein, a color of the first light-emitting diode 410, a color of the second light-emitting diode 420, and a color of the third light-emitting diode 430 individually correspond to the three primary colors. Therefore, the first light-emitting diode 410 may be red, the second light-emitting diode 420 may be green, and the third light-emitting diode 430 may be blue, but are not limited thereto. That is, in other embodiments, the color of the first light-emitting diode 410 may be one of the three primary colors except red, the color of the second light-emitting diode 420 may be one of the three primary colors except green, and the color of the third light-emitting diode 430 may be one of the three primary colors except blue.

In this embodiment, the self-assembled patterns 400a may include a first self-assembled pattern 410a, a second self-assembled pattern 420a, and a third self-assembled pattern 430a. That is, the first light-emitting diode 410 has the first self-assembled pattern 410a, the second light-emitting diode 420 has the second self-assembled pattern 420a, and the third light-emitting diode 430 has the third self-assembled pattern 430a. In this embodiment, the first self-assembled pattern 410a, the second self-assembled pattern 420a, and the third self-assembled pattern 430a are formed through, for example, a sputtering process, a photolithography process, an etch process, etc. Herein, the size and the shape of the first opening 311 correspond to a size and a shape of the first self-assembled pattern 410a, the size and the shape of the second opening 312 correspond to a size and a shape of the second self-assembled pattern 420a, and the size and the shape of the third opening 313 correspond to a size and a shape of the third self-assembled pattern 430a.

Note that a force is provided to allow the self-assembled patterns 400a and the self-assembled material layers 200 to attract each other, so that the self-assembled patterns 400a and the self-assembled material layers 200 may be aligned more accurately to be self-assembled. Hence, in this embodiment, the first light-emitting diode 410 may be self-assembled into the first opening 311 of the first solder mask layer 300 through the force between the first self-assembled pattern 410a and the first self-assembled material layer 210. Herein, the size and the shape of the first self-assembled pattern 410a may correspond to the size and the shape of the first opening 311. The second light-emitting diode 420 may be self-assembled into the second opening 312 of the first solder mask layer 300 through the force between the second self-assembled pattern 420a and the second self-assembled material layer 220. Herein, the size and the shape of the second self-assembled pattern 420a may correspond to the size and the shape of the second opening 312. The third light-emitting diode 430 may be self-assembled into the third opening 313 of the first solder mask layer 300 through the force between the third self-assembled pattern 430a and the third self-assembled material layer 230. Herein, the size and the shape of the third self-assembled pattern 430a may correspond to the size and the shape of the third opening 313. Through such a design, in the light-emitting diode package structure 10 of this embodiment, the problem of poor alignment during transferring of the light-emitting diodes may be improved through the self-assembling manner, and yield of transferring may also be increased. Here, the self-assembled patterns 400a include a magnetic material, the self-assembled material layers 200 include a magnetic material, and a magnetic attraction force is provided between the self-assembled patterns 400a and the self-assembled material layers 200, but is not limited thereto. Herein, the magnetic material may be a material capable of producing magnetism such as iron, cobalt, nickel, or other binary alloy or other multi-element alloy.

Figure 2C:
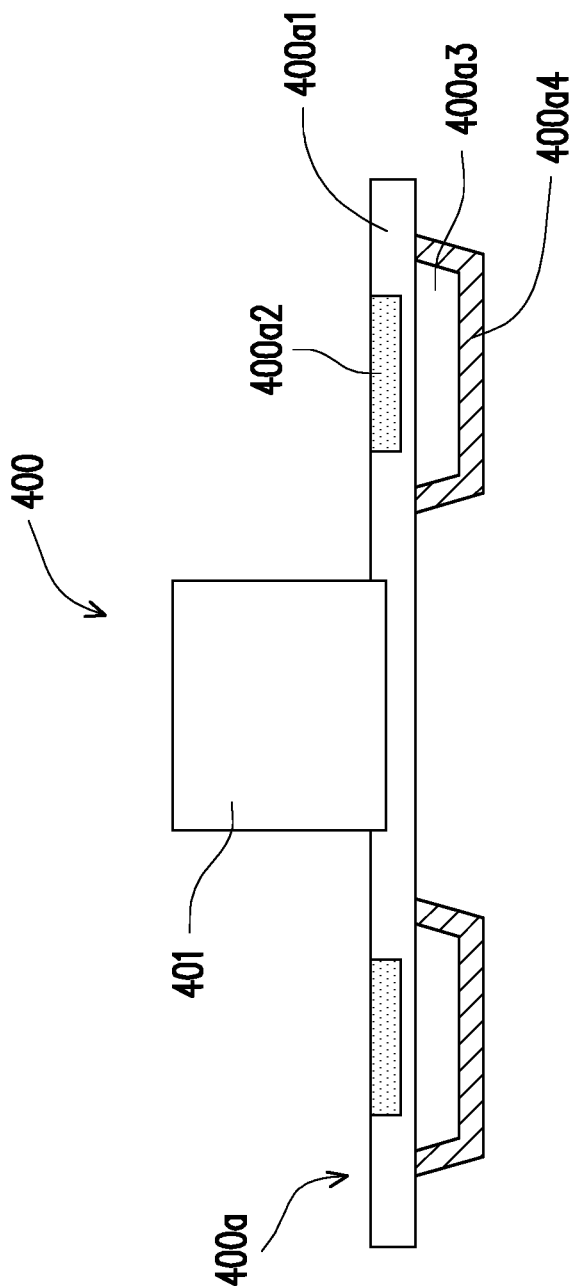
FIG. 2C is another cross-sectional view illustrating the light-emitting diode of FIG. 1D.

In addition, with reference to FIG. 2C, FIG. 2C is another cross-sectional view illustrating the light-emitting diode of FIG. 1D. Herein, the light-emitting diode 400 has a light-emitting diode die 401 and the self-assembled pattern 400a. The self-assembled pattern 400a includes a package substrate 400a1, an adsorption layer 400a2, a conductive contact point layer 400a3, and a third surface treatment layer 400a4. Herein, the light-emitting diode die 401 is fixed on the package substrate 400a1, the adsorption layer 400a2 is embedded in the package substrate 400a1 or on the package substrate 400a1, but are not limited thereto. The conductive contact point layer 400a3 is disposed at one side of the package substrate 400a1 away from the light-emitting diode die 401, and the third surface treatment layer 400a4 is disposed on a surface of the conductive contact point layer 400a3. Here, a material of the third surface treatment layer 400a4 may be, for example, SAC, SnBe, SnSb or other suitable alloy materials.

Figure 1E:
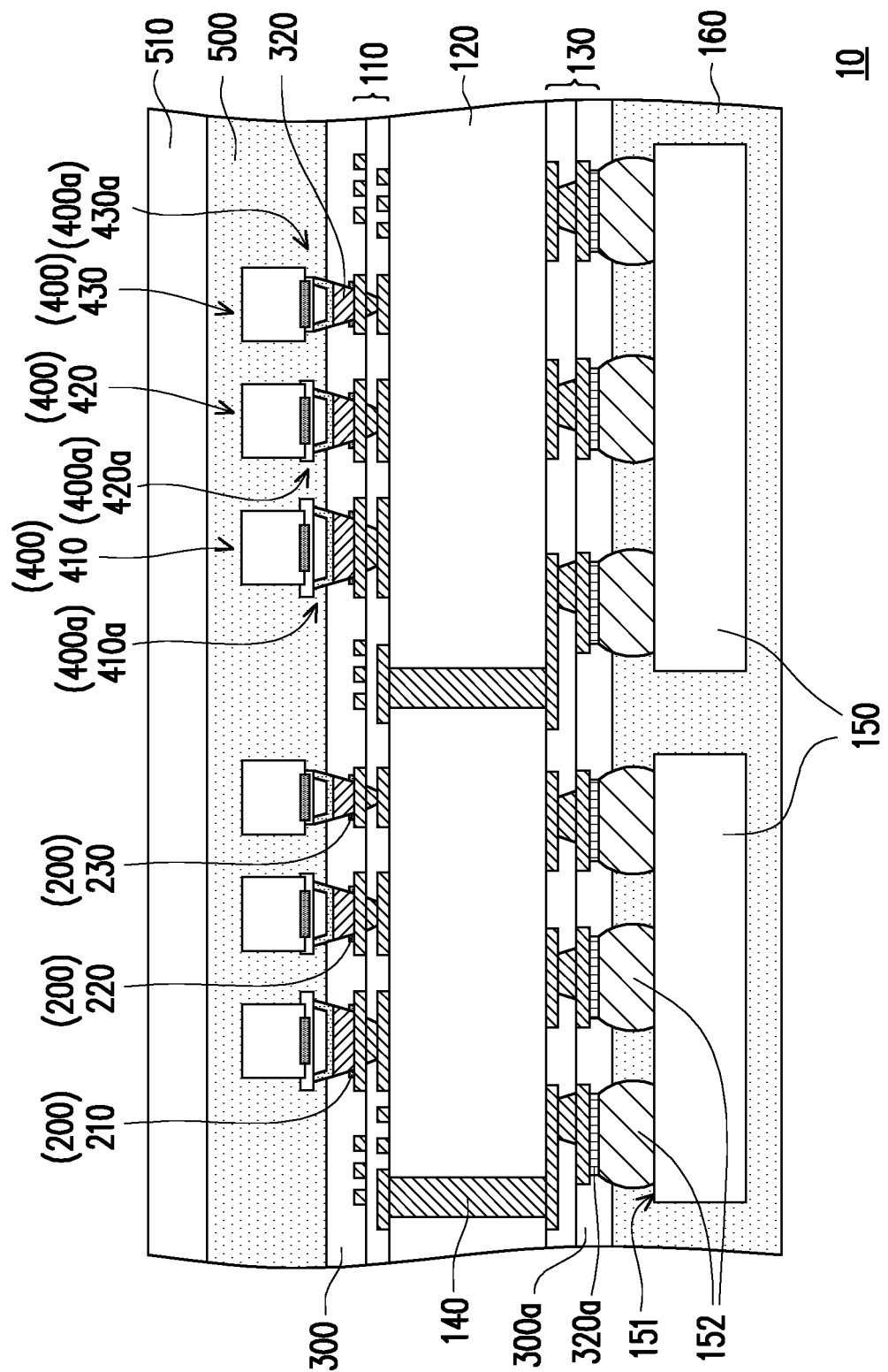

With reference to FIG. 1E, after the light-emitting diodes 400 are disposed on the first build-up circuit 110, an adhesive layer 500 is then formed on the first solder mask layer 300 to encapsulate the light-emitting diodes 400. Next, a light transmissive layer 510 is disposed on the adhesive layer 500, so that the light transmissive layer 510 and the first solder mask layer 300 are separately located at two opposite sides of the adhesive layer 500. Here, a material of the adhesive layer 500 may be, for example, a transparent polymer material, polyimide, benzocyclobutene (BCB), photoimageable dielectric (PID) material, or other light-permeable and adhesive materials. A material of the light transmissive layer 510 may be, for example, glass, quartz, or transparent PET or may be a light-permeable hard material capable of protecting the light-emitting diode die or a soft material such as a resin material featuring high transmittance, polyimide (PI) and the like, but is not limited thereto.

Next, at least one chip 150 (2 chips 120 are schematically illustrated in FIG. 1E) is disposed on the second build-up circuit 130, so that the second surface treatment layers 320a are located between the second build-up circuit 130 and the chips 150, and active surfaces 151 of the chips 150 face the light-emitting diodes 400. Herein, the chips 150 have a plurality of bumps 152, and the bumps 152 are located on the active surfaces 151 of the chips 150 to be electrically connected to the second build-up circuit 130 and the chips 150. Next, an encapsulant 160 is formed to encapsulate the chips 150 and the bumps 152. Herein, the second surface treatment layers 320a are disposed between a portion of the second build-up circuit 130 exposed by the second solder mask layer 300a and the bumps 152. The second solder mask layer 300a is located between the second build-up circuit 130 and the encapsulant 160. Further, the light-emitting diodes 400 and the chips 150 are separately located at two opposite sides of the first build-up circuit 110. Here, a material of the bumps 152 may be, for example, SAC, SnBe, SnSb or other suitable alloy materials. A material of the encapsulant 160 may be, for example, resin or a polymer glass filler composite material. The manufacturing of the light-emitting diode package structure 10 is completed so far.

Note that in the manufacturing method of the light-emitting diode package structure provided by this embodiment, although the light-emitting diodes 400 are disposed on the first build-up circuit 110 first, and the chips 150 are then disposed on the second build-up circuit 130, such an order is not particularly limited by the invention. In other words, in other embodiments, the chips 150 may be disposed on the second build-up circuit 130 before the light-emitting diodes 400 are disposed on the first build-up circuit 110.

Note that although the carrier 100 of the light-emitting diode package structure 10 of this embodiment includes the first build-up circuit 110, the substrate 120, the conductive through holes 140, the second build-up circuit 130, the second solder mask layer 300a, the second surface treatment layers 320a, the bumps 152, the chips 150, and the encapsulant 160, the invention is not intended to limit components of the carrier nor how the components are disposed. That is, in other embodiments, the carrier does not have to include the conductive through holes or the substrate, or the components of the carrier may be disposed in a different manner.

Based on the above, the light-emitting diode package structure 10 of this embodiment includes the carrier 100, the at least one self-assembled material layer 200, the first solder mask layer 300, and at least one light-emitting diode 400. The carrier 100 includes the first build-up circuit 110. The at least one self-assembled material layer 200 is disposed on the first build-up circuit 110. The first solder mask layer 300 is disposed on the first build-up circuit 110. The first solder mask layer 300 has the at least one opening 310 to expose a portion of the at least one self-assembled material layer 200. The at least one light-emitting diode 400 is disposed on the first build-up circuit 110. The at least one light-emitting diode 400 has the self-assembled pattern 400a. The at least one light-emitting diode 400 is self-assembled into the at least one opening 310 of the first solder mask layer 300 through a force between the self-assembled pattern 400a and the at least one self-assembled material layer 200.

It should be noted that the reference numerals and a part of the contents in the previous embodiment are used in the following embodiments, in which identical reference numerals indicate identical or similar components, and repeated description of the same technical contents is omitted. Please refer to the descriptions of the previous embodiment for the omitted contents, which will not be repeated hereinafter.

FIG. 3A to FIG. 3E are schematic cross-sectional views illustrating a manufacturing method of a light-emitting diode package structure according to another embodiment of the invention. With reference to FIG. 1A to FIG. 1E and FIG. 3A to FIG. 3E together, a manufacturing method of a light-emitting diode package structure of this embodiment is similar to the manufacturing method of the light-emitting diode package structure of FIG. 1A to FIG. 1E, and a difference therebetween is that: the substrate 120 is not required to be drilled in a manufacturing method of a light-emitting diode package structure 10a of this embodiment. In addition, a structure of a carrier 100a of the light-emitting diode package structure 10a of this embodiment is different from the structure of the carrier 100 of the light-emitting diode package structure 10.

Figure 3A:
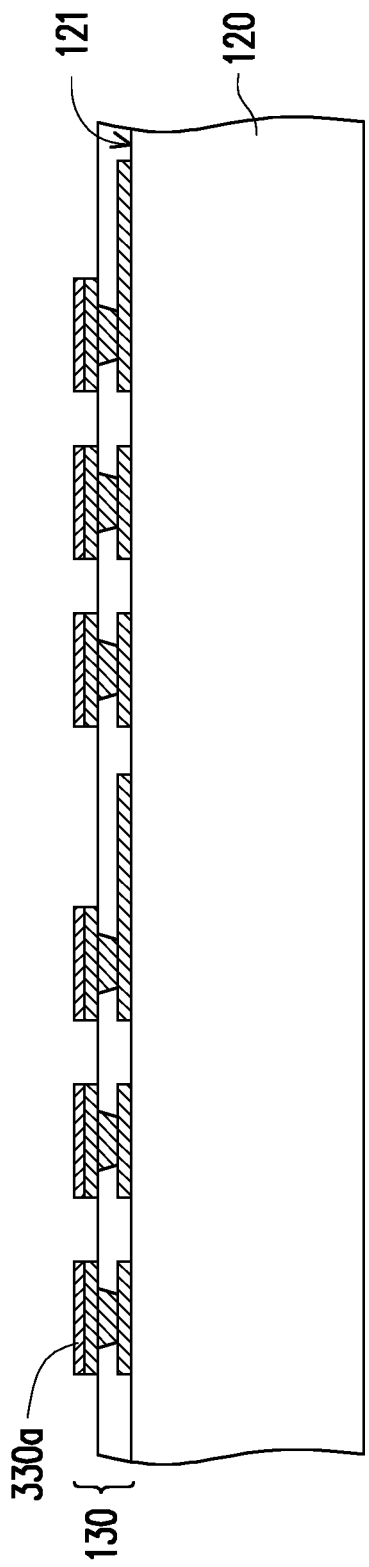
FIG. 3A to FIG. 3E are schematic cross-sectional views illustrating a manufacturing method of a light-emitting diode package structure according to another embodiment of the invention.
Figure 3B:
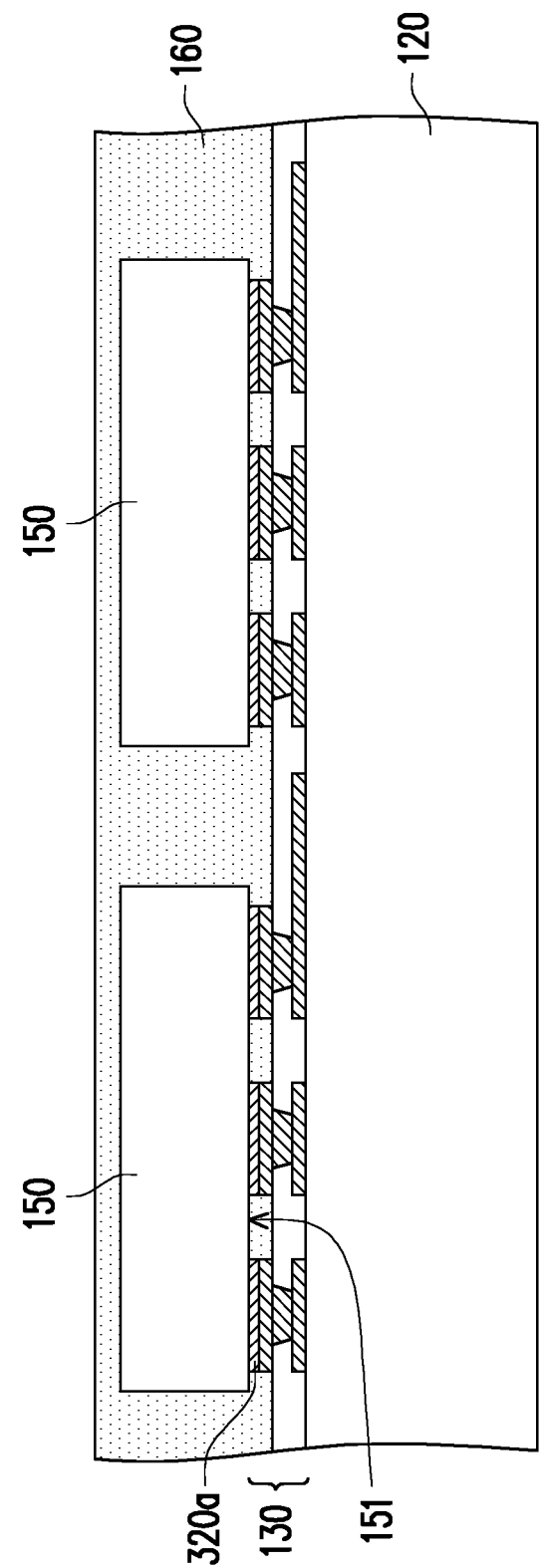
Figure 3C:
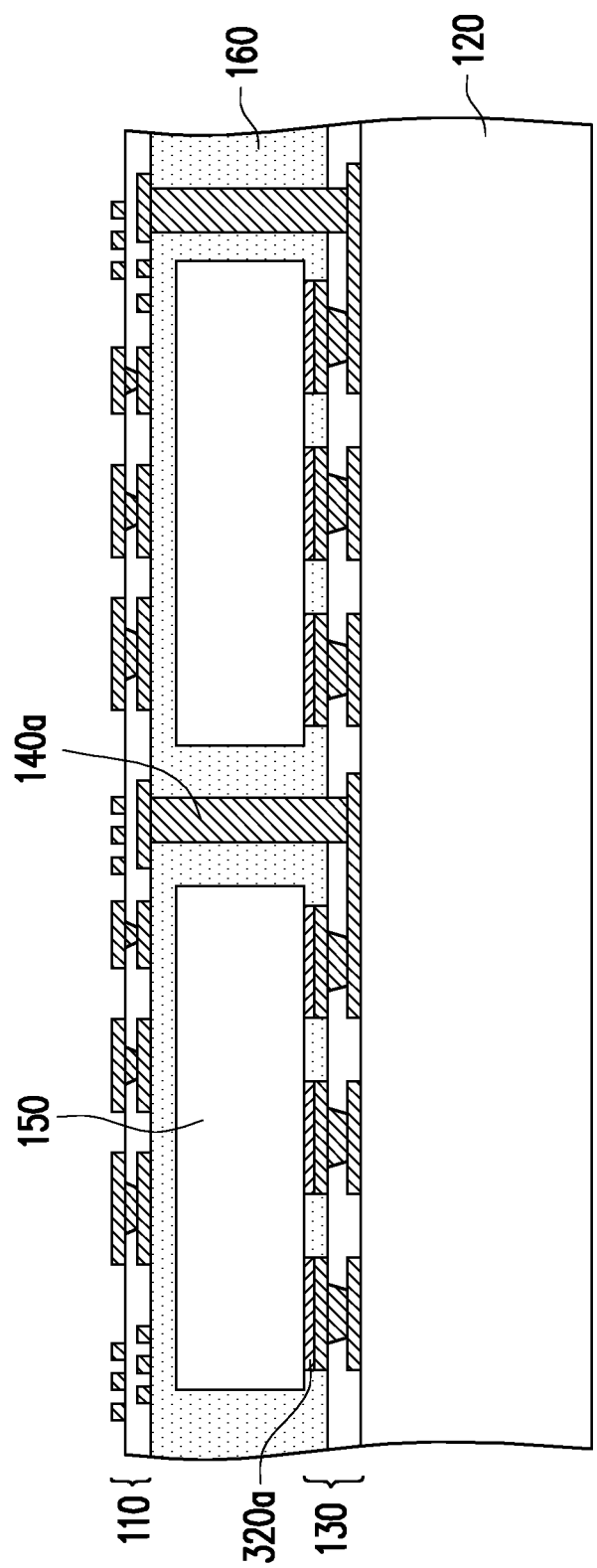

Specifically, with reference to FIG. 3A, in the manufacturing method of the light-emitting diode package structure of this embodiment, the second build-up circuit 130 is formed on the upper surface 121 of the substrate 120 first, and the second surface treatment layers 320a are formed on the second build-up circuit 130. Next, with reference to FIG. 3B, the chips 150 are disposed on the second build-up circuit 130, so that the second surface treatment layers 320a are located between the second build-up circuit 130 and the chips 150. Next, the encapsulant 160 is formed to encapsulate the chips 150, the second surface treatment layers 320a, and the second build-up circuit 130. Next, with reference to FIG. 3C, after the encapsulant 160 is drilled and is filled with a conductive material, conductive through holes 140a penetrating the encapsulant 160 are formed. The first build-up circuit 110 is formed on the encapsulant 160, so that the chips 150 are located between the first build-up circuit 110 and the second build-up circuit 130. The manufacturing of carrier 100a of the light-emitting diode package structure 10a is completed so far. Herein, the carrier 100a of the light-emitting diode package structure 10a of this embodiment includes the first build-up circuit 110, the conductive through holes 140a, the second build-up circuit 130, the encapsulant 160, the chips 150, the second surface treatment layers 320a, and the substrate 120.

Figure 3D:
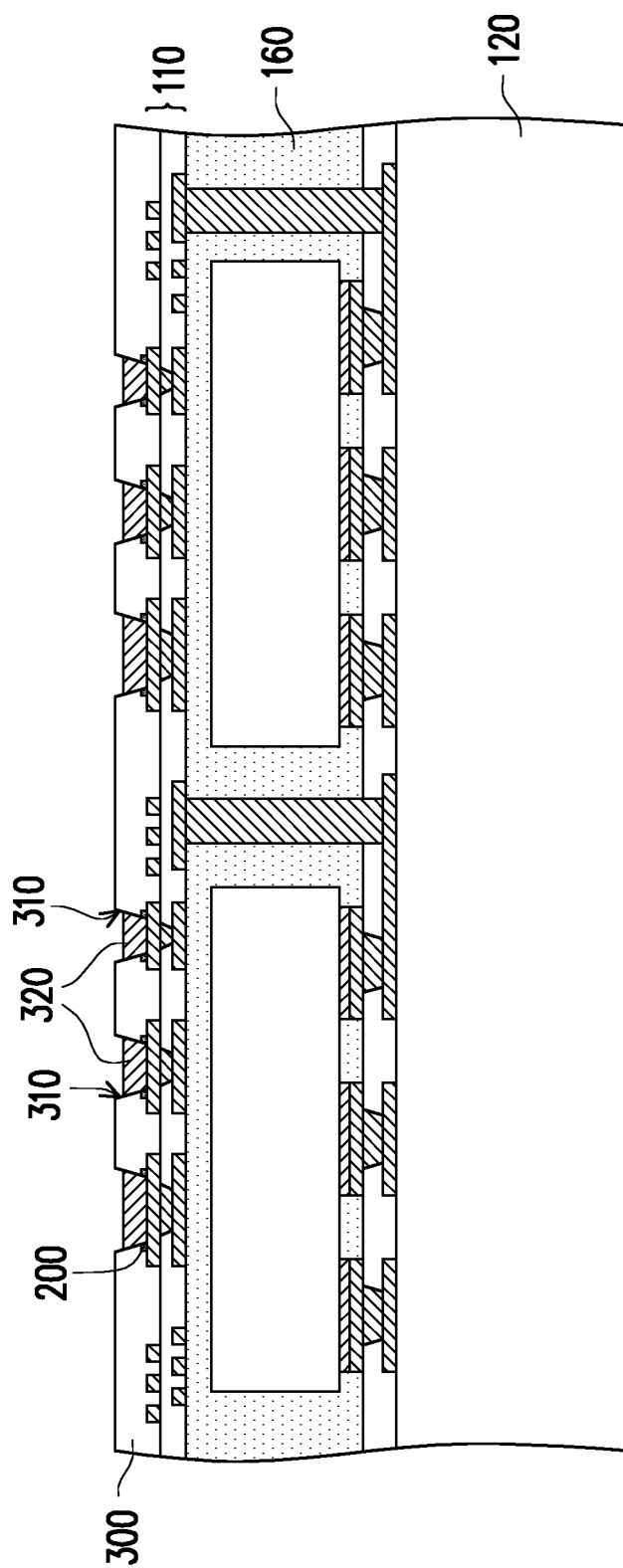

With reference to FIG. 3D, the self-assembled material layers 200 are formed on the first build-up circuit 110, the first solder mask layer 300 is formed on the first build-up circuit 110, and the first surface treatment layers 320 are formed in the openings 310 of the first solder mask layer 300.

Figure 3E:
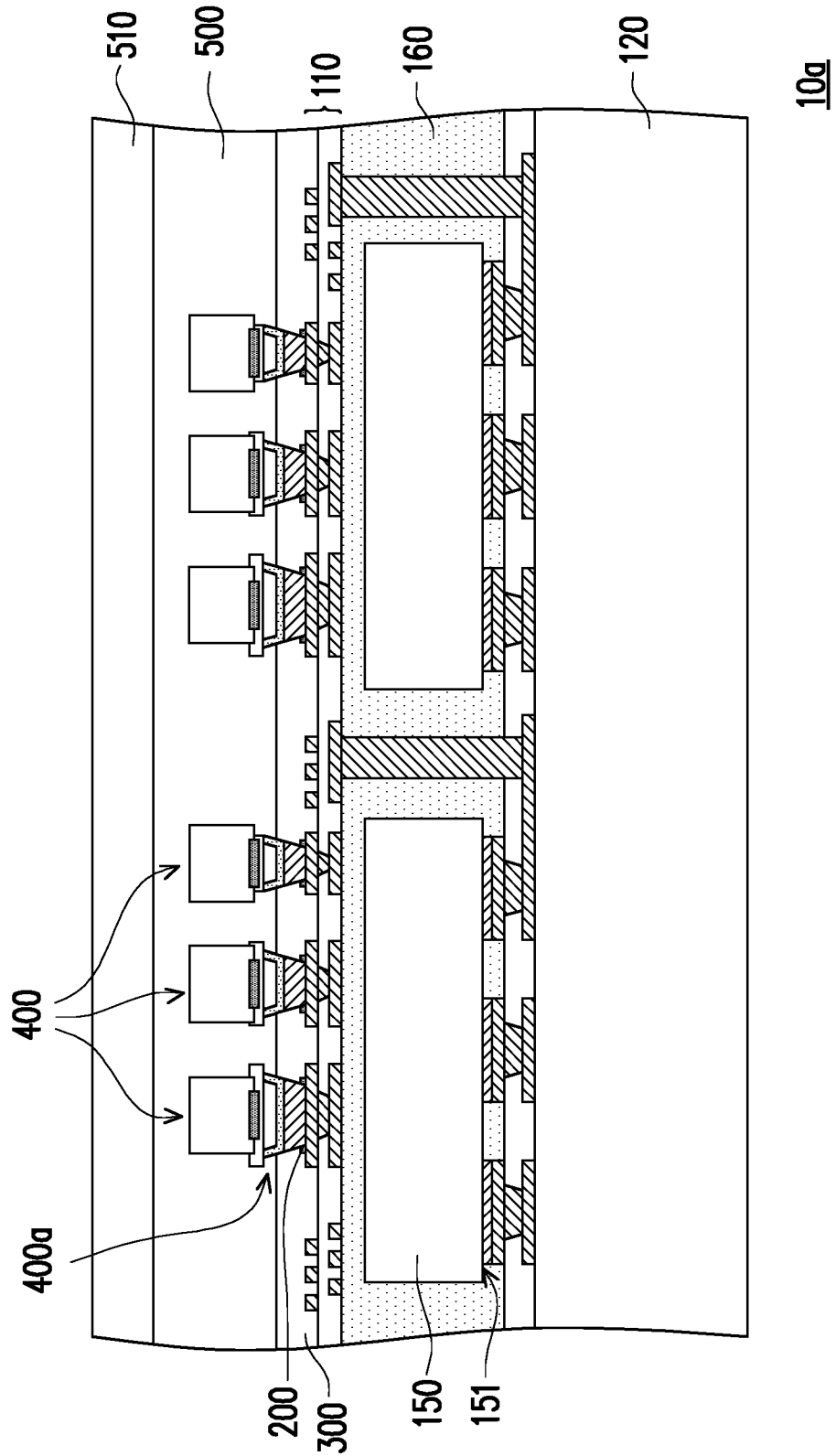

Next, with reference to FIG. 3E, the light-emitting diodes 400 are disposed on the first build-up circuit 110. The light-emitting diodes 400 may be self-assembled into the openings 310 of the first solder mask layer 300 through a force between the self-assembled patterns 400a and the self-assembled material layers 200. The sizes and the shapes of the self-assembled patterns 400a may correspond to the sizes and the shapes of the openings 310. Herein, the active surfaces 151 of the chips 150 face back onto the light-emitting diodes 400, and the light-emitting diodes 400 and the substrate 120 are separately located at two opposite sides of the chips 150. Next, the adhesive layer 500 is formed on the first solder mask layer 300 to encapsulate the light-emitting diodes 400. Next, the light transmissive layer 510 is disposed on the adhesive layer 500, so that the light transmissive layer 510 and the first solder mask layer 300 are separately located at two opposite sides of the adhesive layer 500. The manufacturing of the light-emitting diode package structure 10a is completed so far.

Figure 3F:
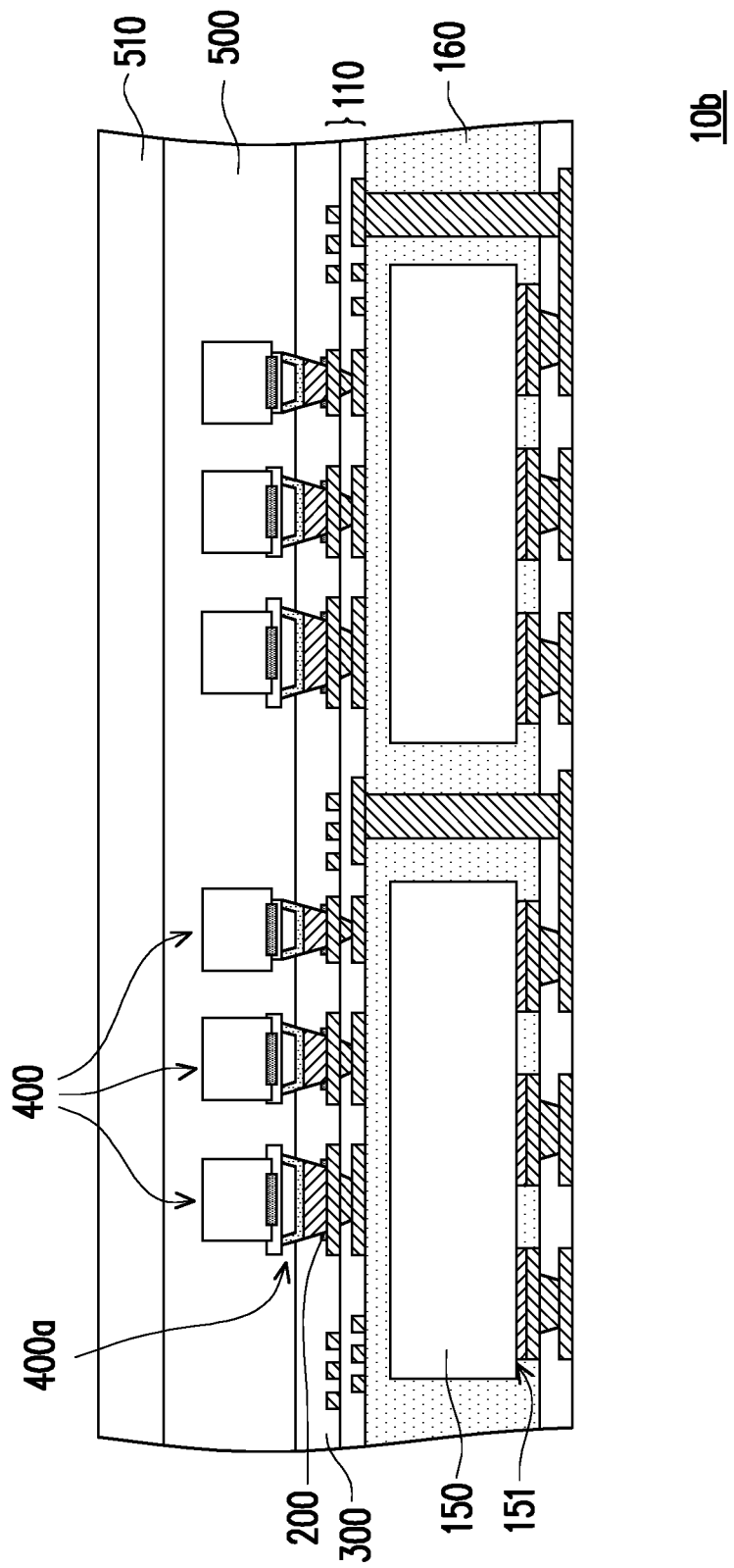
FIG. 3F is a schematic cross-sectional view illustrating the light-emitting diode package structure of FIG. 3E after a substrate is separated.

Note that in other embodiments, a stripping process may be further performed to the light-emitting diode package structure 10a to separate the substrate 120 and to obtain a light-emitting diode package structure 10b without a substrate, as shown in FIG. 3F.

FIG. 4A to FIG. 4D are schematic cross-sectional views illustrating a manufacturing method of a light-emitting diode package structure according to another embodiment of the invention. With reference to FIG. 1A to FIG. 1E and FIG. 3A to FIG. 3E together, a manufacturing method of a light-emitting diode package structure of this embodiment is similar to the manufacturing method of the light-emitting diode package structure of FIG. 1A to FIG. 1E, and a difference therebetween is that: the substrate 120 is not required to be drilled in a manufacturing method of a light-emitting diode package structure of this embodiment. In addition, a structure of a carrier 100b of a light-emitting diode package structure 10c of this embodiment is different from the structure of the carrier 100 of the light-emitting diode package structure 10.

Figure 4A:
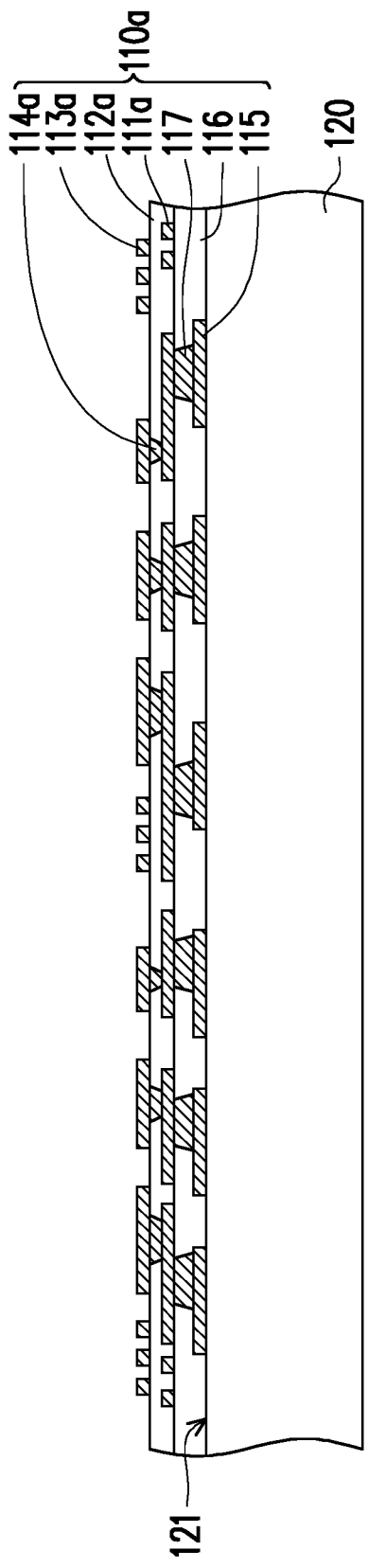
FIG. 4A to FIG. 4D are schematic cross-sectional views illustrating a manufacturing method of a light-emitting diode package structure according to another embodiment of the invention.

Specifically, with reference to FIG. 4A, in the manufacturing method of the light-emitting diode package structure of this embodiment, a first build-up circuit 110a is formed on the upper surface 121 of the substrate 120 first. Herein, the first build-up circuit 110a includes a first conductive layer 111a, a first dielectric layer 112a, a second conductive layer 113a, a first conductive hole 114a penetrating the first dielectric layer 112a, a fifth conductive layer 115, a third dielectric layer 116, and a third conductive hole 117 penetrating the third dielectric layer 116.

Figure 4B:
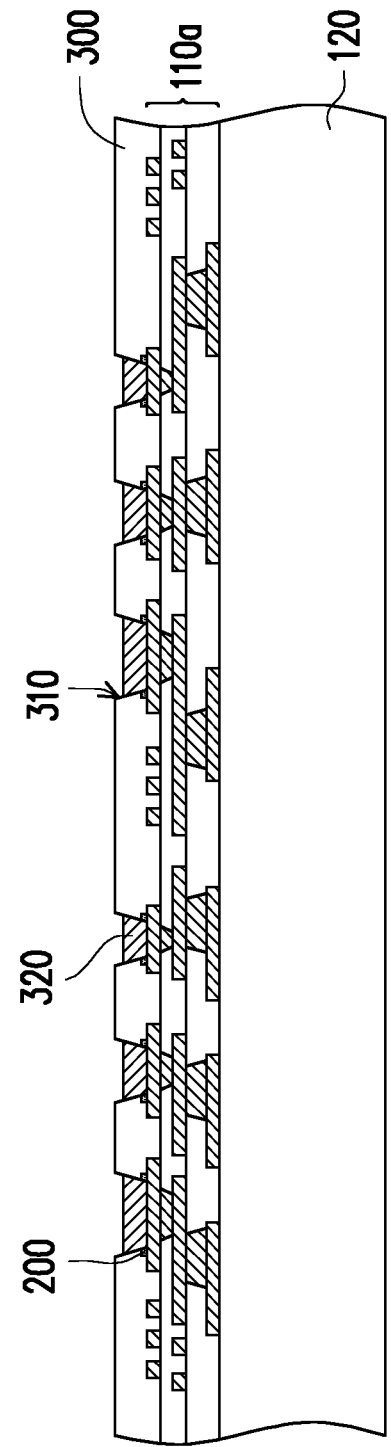

Next, with reference to FIG. 4B, the self-assembled material layers 200 are formed on the first build-up circuit 110a, the first solder mask layer 300 is formed on the first build-up circuit 110, and the first surface treatment layers 320 are formed in the openings 310 of the first solder mask layer 300.

Figure 4C:
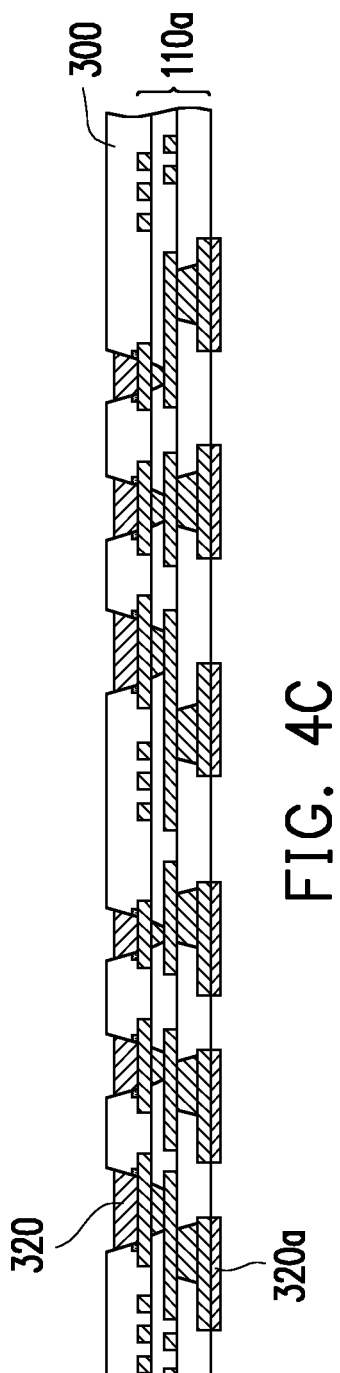

Next, with reference to FIG. 4C, a stripping process is performed to separate the substrate 120. The second surface treatment layers 320a are then formed on the first build-up circuit 110a, so that the second surface treatment layers 320a and the first surface treatment layers 320 are separately located at two opposite sides of the first build-up circuit 110a.

Figure 4D:
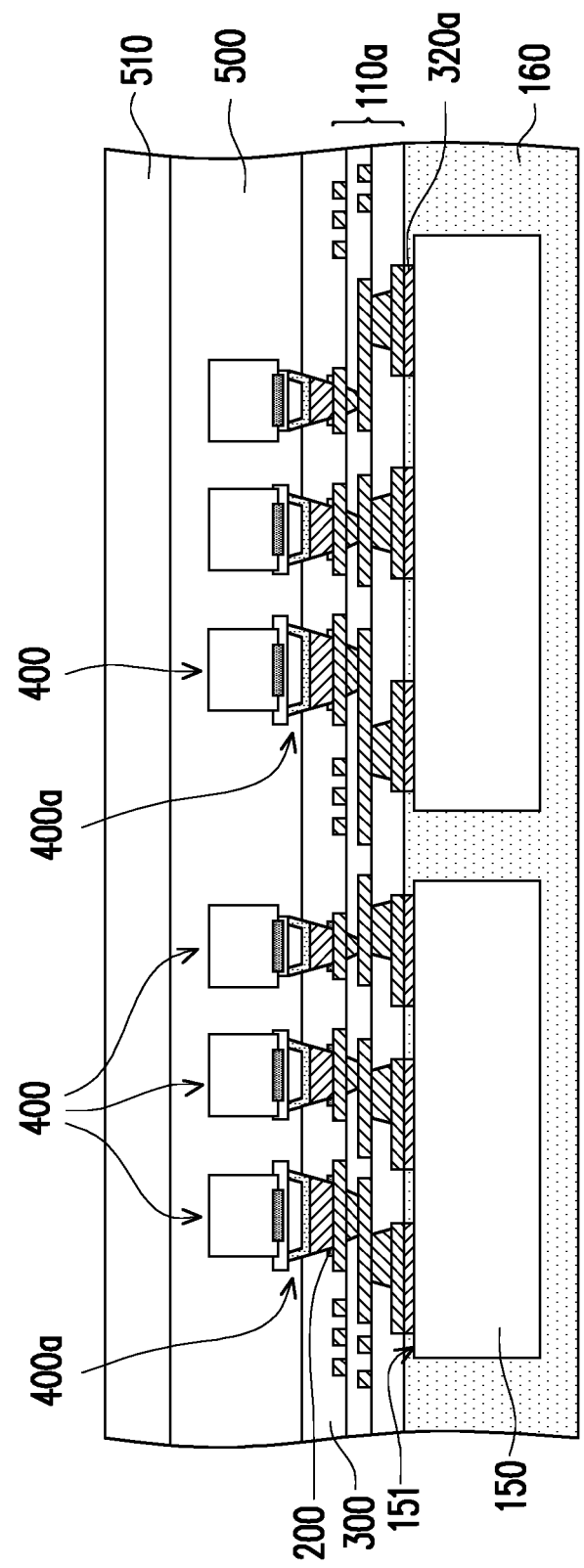

Next, with reference to FIG. 4D, the light-emitting diodes 400 are disposed on the first build-up circuit 110a. The light-emitting diodes 400 may be self-assembled into the openings 310 of the first solder mask layer 300 through a force between the self-assembled patterns 400a and the self-assembled material layers 200. The sizes and the shapes of the self-assembled patterns 400a may correspond to the sizes and the shapes of the openings 310. Next, the adhesive layer 500 is formed on the first solder mask layer 300 to encapsulate the light-emitting diodes 400. The light transmissive layer 510 is disposed on the adhesive layer 500, so that the light transmissive layer 510 and the first solder mask layer 300 are separately located at two opposite sides of the adhesive layer 500. The chips 150 are disposed on the first build-up circuit 110a, so that the light-emitting diodes 400 and the chips 150 are separately located at two opposite sides of the first build-up circuit 110a. Next, the encapsulant 160 is formed to encapsulate the chips 150, the second surface treatment layers 320a, and the first build-up circuit 110a. The manufacturing of the light-emitting diode package structure 10c is completed so far. Herein, the carrier 100b of the light-emitting diode package structure 10c of this embodiment includes the first build-up circuit 110a, the second surface treatment layers 320a, the chips 150, and the encapsulant 160.

In view of the foregoing, in the light-emitting diode package structure provided by the embodiments of the invention, the light-emitting diode package structure includes the carrier, the self-assembled material layers, the first solder mask layer, and the light-emitting diodes having the self-assembled patterns. Herein, the light-emitting diodes are self-assembled into the openings of the first solder mask layer through a force between the self-assembled patterns and the self-assembled material layers, so that the light-emitting diodes are disposed on the carrier. Through such a design, in the light-emitting diode package structure of this invention, the problem of poor alignment during transferring of the light-emitting diodes is improved, and the yield of transferring is also increased.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A light-emitting diode package structure, comprising:
   a carrier, comprising a first build-up circuit;
   at least one self-assembled material layer, disposed on the first build-up circuit;
   a first solder mask layer, disposed on the first build-up circuit, having at least one opening to expose a portion of the at least one self-assembled material layer; and
   at least one light-emitting diode, disposed on the first build-up circuit, having a self-assembled pattern, wherein the at least one light-emitting diode is self-assembled into the at least one opening of the first solder mask layer through a force between the self-assembled pattern and the at least one self-assembled material layer,
   wherein the self-assembled pattern comprises a magnetic material, and the at least one self-assembled material layer comprises a magnetic material.

2. The light-emitting diode package structure as claimed in claim 1, wherein the at least one opening comprises at least one first opening, at least one second opening, and at least one third opening, wherein a size of the at least one first opening is greater than a size of the at least one second opening, and the size of the at least one second opening is greater than a size of the at least one third opening.

3. The light-emitting diode package structure as claimed in claim 2, wherein the at least one light-emitting diode comprises at least one first light-emitting diode, at least one second light-emitting diode, and at least one third light-emitting diode, the at least one first light-emitting diode has a first self-assembled pattern, the at least one second light-emitting diode has a second self-assembled pattern, and the at least one third light-emitting diode has a third self-assembled pattern, wherein the size of the at least one first opening, the size of the at least one second opening, and the size of the at least one third opening respectively correspond to a size of the first self-assembled pattern, a size of the second self-assembled pattern, and a size of the third self-assembled pattern.

4. The light-emitting diode package structure as claimed in claim 3, wherein a shape of the at least one first opening, a shape of the at least one second opening, and a shape of the at least one third opening respectively correspond to a shape of the first self-assembled pattern, a shape of the second self-assembled pattern, and a shape of the third self-assembled pattern.

5. The light-emitting diode package structure as claimed in claim 1, further comprising:
   at least one first surface treatment layer, disposed in the at least one opening of the first solder mask layer;
   an adhesive layer, disposed on the first solder mask layer, encapsulating the at least one light-emitting diode; and
   a light transmissive layer, disposed on the adhesive layer, the light transmissive layer and the first solder mask layer separately located at two opposite sides of the adhesive layer,
   wherein the carrier further comprises:
   at least one chip, having an active surface; and an encapsulant, encapsulating the at least one chip, wherein the at least one light-emitting diode and the at least one chip are separately located at two opposite sides of the first build-up circuit.

6. The light-emitting diode package structure as claimed in claim 5, wherein the carrier further comprises:
   a second build-up circuit, disposed on the at least one chip;
   at least one second surface treatment layer, disposed between the second build-up circuit and the active surface of the at least one chip; and
   at least one conductive through hole, electrically connected to the first build-up circuit and the second build-up circuit.

7. The light-emitting diode package structure as claimed in claim 6, wherein the carrier further comprises:
   a substrate, disposed between the first build-up circuit and the second build-up circuit;
   a plurality of bumps, disposed on the active surface of the at least one chip to be electrically connected to the second build-up circuit and the at least one chip; and
   a second solder mask layer, disposed between the second build-up circuit and the encapsulant, exposing a portion of the second build-up circuit, wherein the at least one second surface treatment layer is disposed between the portion of the second build-up circuit exposed by the second solder mask layer and the bumps, the at least one conductive through hole penetrates the substrate, and the active surface faces the at least one light-emitting diode.

8. The light-emitting diode package structure as claimed in claim 6, wherein the at least one conductive through hole penetrates the encapsulant, the active surface backs onto the at least one light-emitting diode, and the carrier further comprises:
   a substrate, disposed on the second build-up circuit, the at least one light-emitting diode and the substrate being respectively located at two opposite sides of the at least one chip.

9. The light-emitting diode package structure as claimed in claim 5, wherein the carrier further comprises:
   at least one second surface treatment layer, disposed between the first build-up circuit and the active surface of the at least one chip, wherein the active surface faces the at least one light-emitting diode.

* * * * *